US011452241B2

(12) United States Patent
Tufty et al.

(10) Patent No.: US 11,452,241 B2
(45) Date of Patent: Sep. 20, 2022

(54) LIQUID SUBMERSION COOLED SERVER MODULE ASSEMBLIES AND SERVER SYSTEMS THAT INCLUDE THE SERVER MODULE ASSEMBLIES

(71) Applicant: LiquidCool Solutions, Inc., Rochester, MN (US)

(72) Inventors: Lyle Rick Tufty, Rochester, MN (US); Steve Shafer, Rochester, MN (US); Rafael Alba, Rochester, MN (US); Gary Allen Reed, Rochester, MN (US)

(73) Assignee: LiquidCool Solutions, Inc., Rochester, MN (US)

( * ) Notice: Subject to any disclaimer, the term of this patent is extended or adjusted under 35 U.S.C. 154(b) by 0 days.

(21) Appl. No.: 16/950,471

(22) Filed: Nov. 17, 2020

(65) Prior Publication Data

US 2021/0153390 A1    May 20, 2021

Related U.S. Application Data

(60) Provisional application No. 62/936,777, filed on Nov. 18, 2019.

(51) Int. Cl.
*H05K 7/20* (2006.01)
*H05K 7/14* (2006.01)
*G06F 1/18* (2006.01)

(52) U.S. Cl.
CPC ......... *H05K 7/20772* (2013.01); *G06F 1/189* (2013.01); *H05K 7/1492* (2013.01); *H05K 7/20236* (2013.01); *H05K 7/20781* (2013.01)

(58) Field of Classification Search
CPC .......... H05K 7/20236; H05K 7/20809; H05K 7/1492; G06F 1/189
See application file for complete search history.

(56) References Cited

U.S. PATENT DOCUMENTS

| 7,905,106 | B2 | 3/2011 | Attlesey | |
|---|---|---|---|---|
| 7,911,793 | B2 | 3/2011 | Attlesey | |
| 8,089,764 | B2 | 1/2012 | Attlesey | |
| 8,964,396 | B1 * | 2/2015 | Dailey | H02B 1/21 361/624 |

(Continued)

OTHER PUBLICATIONS

International Search Report and Written Opinion of the International Searching Authority issued in International Application No. PCT/IB2020/060867, dated Feb. 25, 2021, 11 pages.

*Primary Examiner* — Robert J Hoffberg
(74) *Attorney, Agent, or Firm* — Hamre, Schumann, Mueller & Larson, P.C.

(57) ABSTRACT

A server system formed by a first group of liquid submersion cooled servers, which are part of one or more server module assemblies mounted on the rack. A first power shelf is mounted on the rack and is electrically connected to the first group of liquid submersion cooled servers to provide electrical power to the first group. In addition, a second group of liquid submersion cooled servers, which are part of one or more server module assemblies is also mounted on the rack below the first group. A second power shelf is mounted on the rack below the first group and below the first power shelf, and the second power shelf is electrically connected to the second group of liquid submersion cooled servers to provide electrical power to the second group.

18 Claims, 18 Drawing Sheets

(56) References Cited

U.S. PATENT DOCUMENTS

| | | | |
|---|---|---|---|
| 9,417,664 B1* | 8/2016 | Dailey | H05K 7/1454 |
| 9,451,726 B2 | 9/2016 | Regimbal et al. | |
| 9,622,373 B1* | 4/2017 | Sarti | H02M 1/42 |
| 10,390,458 B2 | 8/2019 | Tufty et al. | |
| 10,548,245 B2* | 1/2020 | Lipp | H05K 7/20772 |
| 10,609,839 B1 | 3/2020 | Archer et al. | |
| 10,785,897 B2* | 9/2020 | Lipp | H05K 7/20836 |
| 2013/0094146 A1 | 4/2013 | Tufty et al. | |
| 2014/0247540 A1 | 9/2014 | Steeves et al. | |
| 2015/0189787 A1 | 7/2015 | Bailey et al. | |
| 2019/0090383 A1 | 3/2019 | Tufty et al. | |
| 2019/0215979 A1 | 7/2019 | Chen et al. | |
| 2021/0410336 A1* | 12/2021 | Yao | H05K 7/20836 |

* cited by examiner

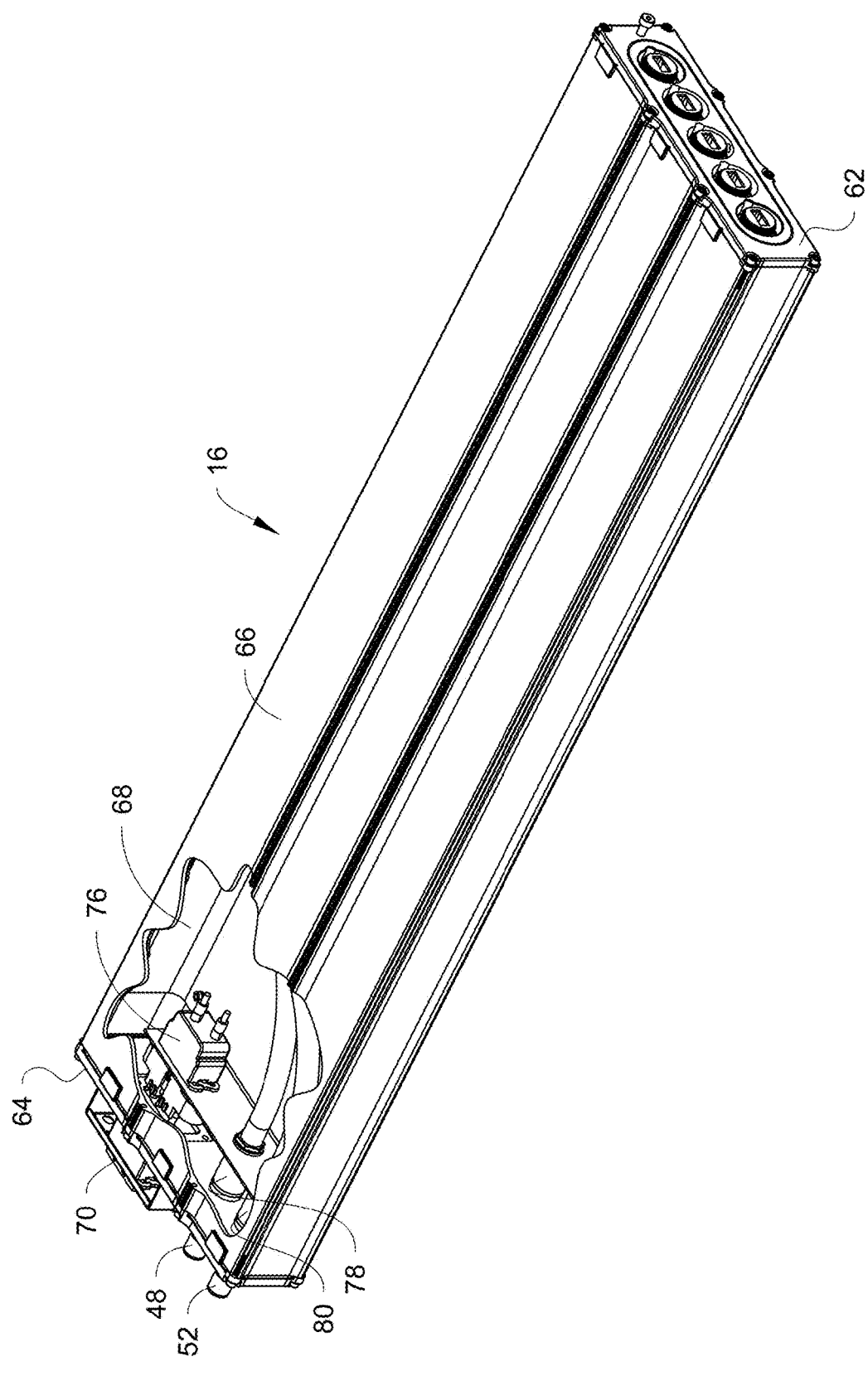

LIQUID SUBMERSION COOLED SERVER MODULE ASSEMBLIES AND SERVER SYSTEMS THAT INCLUDE THE SERVER MODULE ASSEMBLIES

FIELD

This disclosure relates to liquid submersion cooling of electronic array systems and devices.

BACKGROUND

Liquid submersion cooled electronic systems and devices are known. One example of an array of liquid submersion cooled electronic devices is an array of liquid submerged servers (LSS's) arranged in a rack system. An example of an array of LSS's in a rack system is disclosed in U.S. Pat. Nos. 7,905,106, 7,911,793, and 8,089,764. Additional examples of arrays of liquid submersion cooled electronic devices are disclosed in U.S. Pat. Nos. 9,451,726 and 10,390,458, and in U.S. patent application Ser. No. 16/145,408 filed on Sep. 28, 2018 and titled Liquid Submersion Cooled Electronic Systems and Devices.

SUMMARY

Liquid submersion cooled devices and systems are described that use a cooling liquid, for example a dielectric cooling liquid, to submersion cool heat generating electronic computing components or heat generating electronic components used in electronic devices such as servers. Server module assemblies that include a plurality of liquid submersion cooled servers, and server systems that utilize the server module assemblies are also described.

The liquid submersion cooled servers and server module assemblies described herein are configured so that they are suitable for use in a server rack. The server rack can have any configuration that is suitable for operably receiving the liquid submersion cooled servers and server module assemblies thereon. In one embodiment, the server rack can be configured based on the Open Compute Project rack specifications.

In one embodiment described herein, a server system can be formed by a first group of liquid submersion cooled servers, which can be part of one or more server module assemblies, mounted on the rack. A first power shelf is mounted on the rack and is electrically connected to the first group of liquid submersion cooled servers to provide electrical power to the first group. In addition, a second group of liquid submersion cooled servers, which can be part of one or more server module assemblies, is also mounted on the rack below the first group. A second power shelf is mounted on the rack below the first group and below the first power shelf, and the second power shelf is electrically connected to the second group of liquid submersion cooled servers to provide electrical power to the second group.

In another embodiment described herein, a server module assembly can include a module chassis that is configured to mount a plurality of liquid submersion cooled servers thereon, with the module chassis including a front side and a rear side, and power connectors disposed at the rear side. A bus bar connector strip is disposed at the rear side of the module chassis, and the bus bar connector strip includes bus bar electrical connectors spaced from one another along a length of the bus bar connector strip. Each bus bar electrical connector is electrically connected to two of the power connectors. In addition, two or more liquid submersion cooled servers are mounted on the module chassis. Each liquid submersion cooled server includes: a housing defining an interior space and having a front wall and a rear wall, a heat generating electronic computing component within the interior space, a dielectric cooling liquid within the interior space and submerging, and in direct contact with, the heat generating electronic computing component, and a server power connector connected to the rear wall and configured to blind mate connect with one of the power connectors of the module chassis, whereby each one of the server power connectors directs electrical power into the interior space of the corresponding liquid submersion cooled server for powering the heat generating electronic computing component.

DRAWINGS

FIG. 7A is a perspective view of the liquid submersion cooled server showing an example of an interior construction thereof.

DETAILED DESCRIPTION

Rack-based server systems are described in the following description that utilize server module assemblies mounted on racks. Each server module assembly includes a plurality of liquid submersion cooled servers that utilize a cooling liquid, for example a dielectric cooling liquid, to submersion cool heat generating electronic computing components and/or other heat generating electronic components of the liquid submersion cooled servers.

The cooling liquid is preferably a single phase dielectric cooling liquid. It is preferred that the single phase dielectric cooling liquid have a high enough thermal transfer capability and heat capacity to handle the amount of heat being generated by the submerged heat generating electronic component(s) so that the cooling liquid does not change state from a liquid to a gas during the heat absorption process. Submersion cooling of the heat generating electronic component(s) means that enough of the cooling liquid is present so that one or more of the heat generating electronic component(s) are partially or fully submerged in the dielectric cooling liquid in direct intimate contact with the dielectric cooling liquid.

The heat-generating electronic component(s) to be submerged in the cooling liquid can be any electronic component(s) that generates heat and that one may wish to cool by partially or fully submerging the electronic components in the cooling liquid. For example, the electronic component(s) can include one or more processors, for example a CPU and/or a GPU, one or more power supplies, one or more switches, one or more data storage drives, one or more memory modules, and other electronic components. In some embodiments, the electronic systems formed by the electronic components can be systems other than servers including, but not limited to, disk arrays/storage systems, solid state memory devices, storage area networks, network attached storage, storage communication systems, routers, telecommunication infrastructure/switches, wired, optical and wireless communication devices, cell processor devices, printers, power supplies, and the like.

The server systems described herein can be used in any desired application in which servers are used. One example application is use in blockchain computing (cryptocurrency) applications, for example in either ASIC or GPU computer mining configurations. The server systems can also be used in deep learning applications, for example in multi-GPU configurations supporting maximum bandwidth and direct memory access (DMA) of high performance GPUs. The server systems can also be used in artificial intelligence and high-performance computing (HPC) clusters with multiple co-processor configurations, for example multi-GPU configurations supporting DMA capabilities of GPU co-processors. Many other applications and uses of the server systems described herein are possible and are contemplated.

Figure 1:
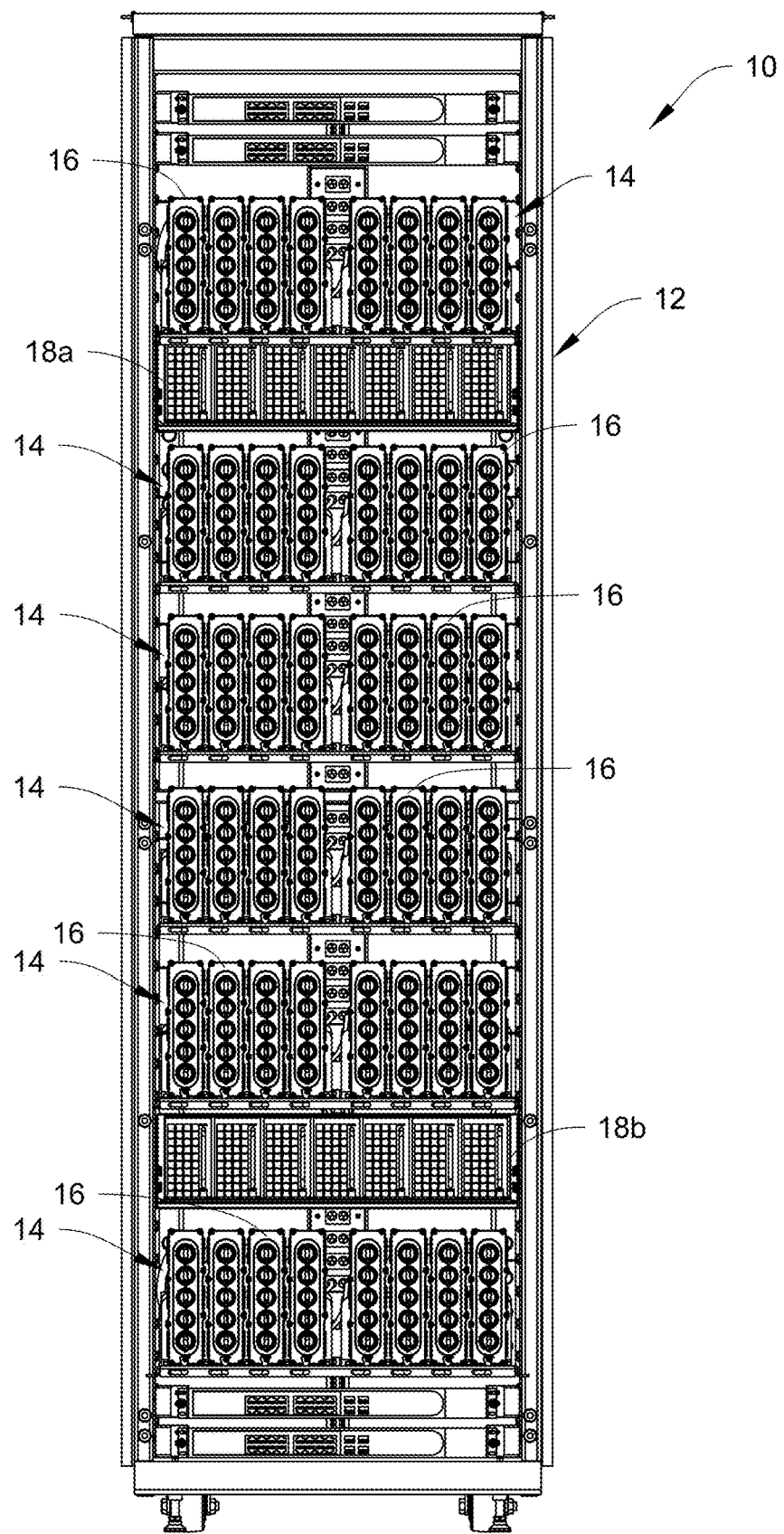
FIG. 1 is a front view of one embodiment of a server system described herein.
Figure 2:
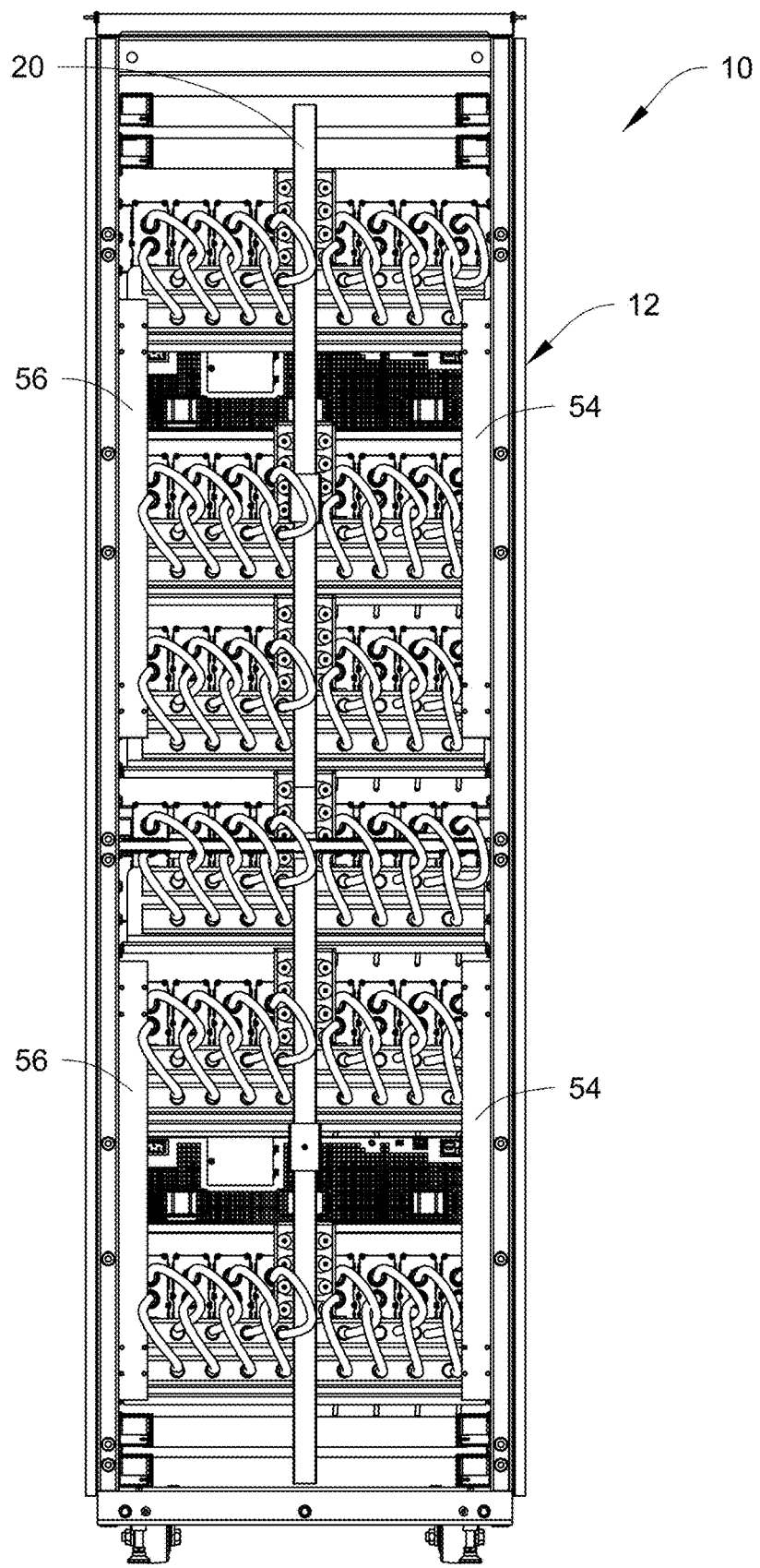
FIG. 2 is a rear view of the server system of FIG. 1.

Referring initially to FIGS. 1 and 2, one embodiment of a rack-based server system 10 is illustrated. The server system 10 includes a rack 12 and a plurality of server module assemblies 14 mounted on the rack 12 at different vertical levels. The illustrated example depicts six (6) of the server module assemblies, although a larger or smaller number of server module assemblies 14 can be used. The rack 12 is substantially conventional in construction. In one embodiment, the rack 12 has a configuration that is based on, and satisfies, the Open Compute Project rack specifications.

With continued reference to FIGS. 1 and 2, a first power shelf 18a and a second power shelf 18b are also mounted on the rack 12 for powering the server module assemblies 14. The power shelves 18a, 18b are of conventional construction known in the art. In the illustrated configuration, the first power shelf 18a is dedicated to and powers the three upper server module assemblies 14, and the second power shelf 18b is dedicated to and powers the three lower server module assemblies 14. As best seen in FIG. 2, the rack 12 further includes an electrical power bus bar 20 that extends vertically along the rack 12 at the rear side thereof. The bus bar 20 provides power to the server module assemblies 14.

Figure 3:
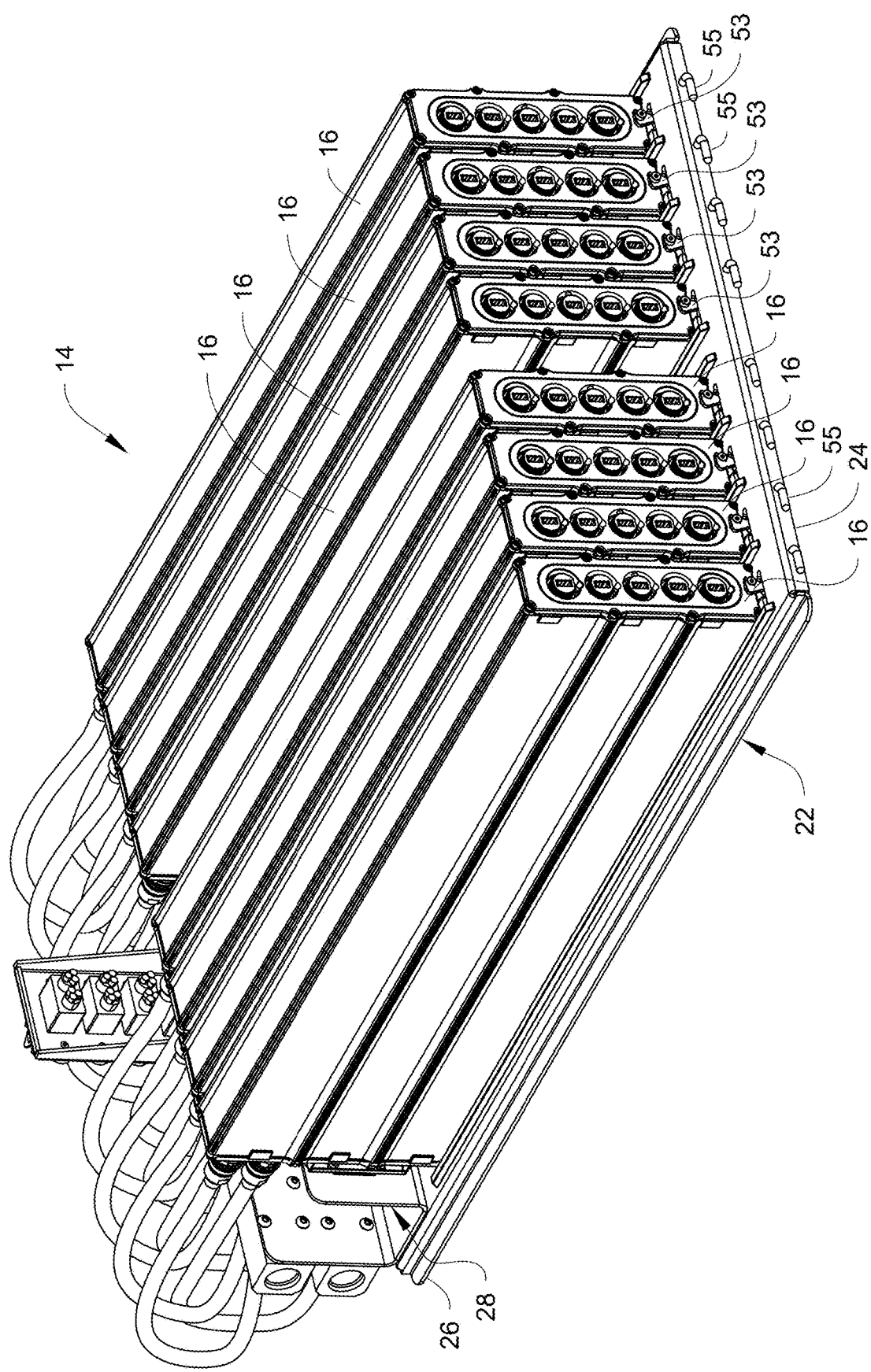
FIG. 3 is a front perspective view of one of the server module assemblies of the server system of FIG. 1.
Figure 4:
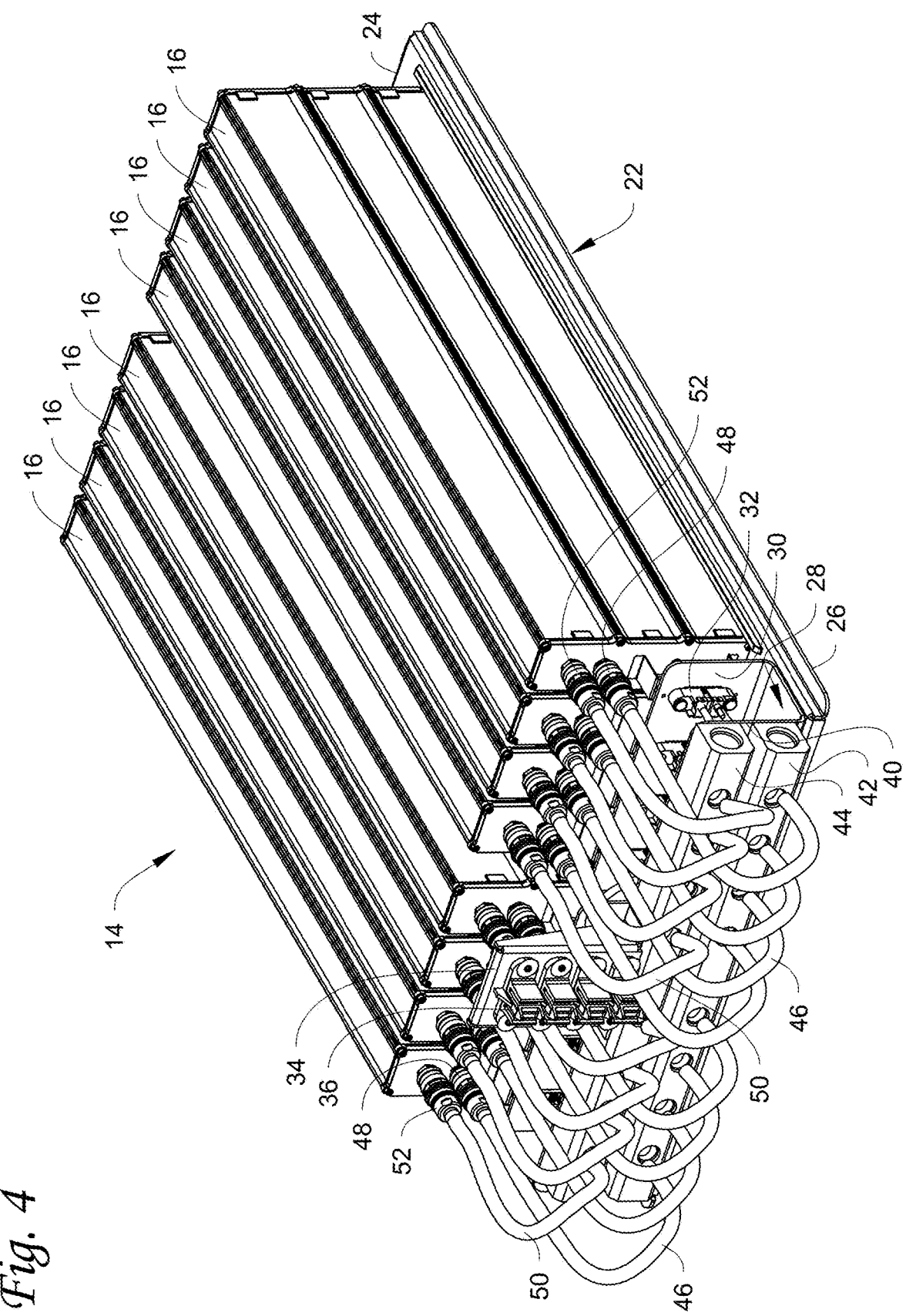
FIG. 4 is a rear perspective view of the server module assembly of FIG. 3.

Turning now to FIGS. 3 and 4, an embodiment of one of the server module assemblies 14 is illustrated. The server module assemblies 14 are substantially identical to one another, however they can have different constructions in some embodiments. In the illustrated example, each server module assembly 14 is depicted as including eight (8) liquid submersion cooled servers 16, although a larger or smaller number of liquid submersion cooled servers 16 can be used on each server module assembly 14.

Each server module assembly 14 includes a module chassis 22 that is configured to mount the liquid submersion cooled servers 16 thereon in a vertical orientation. The module chassis 22 includes a front side 24 and a rear side 26 with the front side 24 disposed toward the front of the rack 12 and the rear side 26 disposed toward the rear of the rack 12. The module chassis 22 can be slidably mounted on the rack 12 to allow the module chassis 22 and the servers 16 disposed thereon, to be slid into and out from the rack 12.

Figure 5:
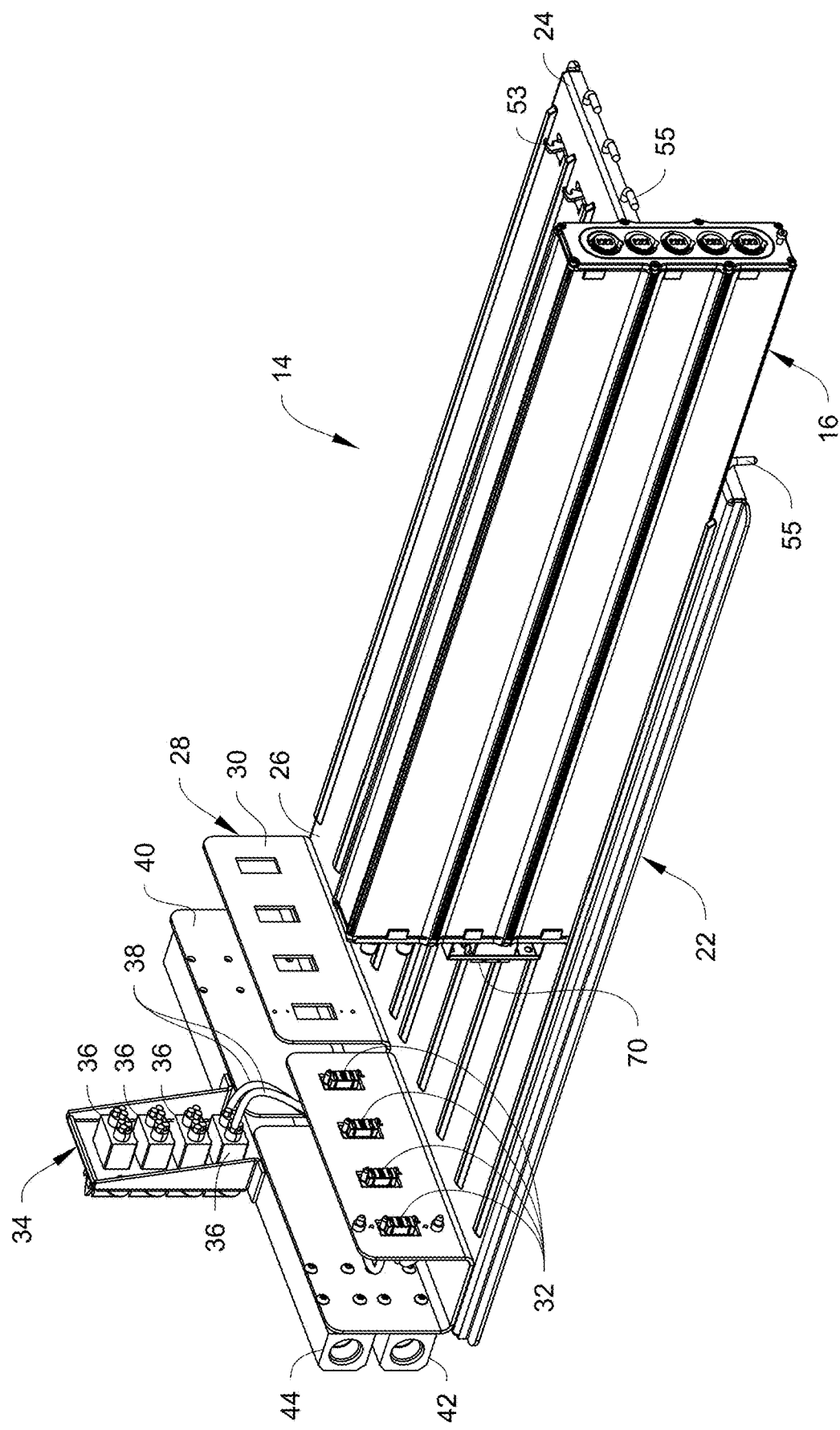
FIG. 5 is a perspective view similar to FIG. 3 but with the individual liquid submersion cooled servers removed from the module chassis.

A U-shaped bracket 28 is fixed to the module chassis 22 at the rear side 26 thereof. The U-shaped bracket 28 is configured to interface with each one of the servers 16 and with the bus bar 20 to direct electrical power from the bus bar 20 into each server 16. For example, as best seen in FIGS. 4 and 5, a front wall 30 of the U-shaped bracket 28 includes a plurality of blind-mate power connectors 32, one for each of the servers 16, that extend through the wall 30. A bus bar connector strip 34 is disposed at the rear side 26 of the module chassis 22, with the bus bar connector strip 34 having bus bar electrical connectors 36, in the illustrated example 4 connectors 36, spaced from one another along a length of the bus bar connector strip 34. Each bus bar electrical connector 36 is electrically connected to two of the power connectors 32 via wires 38. The bus bar electrical connectors 36 are conventional in construction and include biased clips that slidably receive a terminal of the bus bar 20 therein.

Returning to FIGS. 3-5, a rear wall 40 of the U-shaped bracket 28 includes a cooling liquid supply manifold 42 and a cooling liquid return manifold 44 mounted thereon. The manifolds 42, 44 are arranged horizontally on the bracket 28 so that longitudinal axes of the manifolds 42, 44 extend horizontally. The supply manifold 42 supplies returning cool cooling liquid to each of the servers 16, while the return manifold 44 receives warm or heated cooling liquid from each of the servers 16 after cooling the electronic component(s) in the servers 16. Cooling liquid supply lines 46 extend from the supply manifold 42 to a cooling liquid inlet 48 provided on each one of the servers 16, and cooling liquid return lines 50 extend from the return manifold 44 to a cooling liquid outlet 52 on each one of the servers 16. Connection between the supply lines 46 and the inlets 48, and between the return lines 50 and the outlets 52, can be provided via manual fluid couplings as depicted in FIG. 4. In other embodiments, described further below, connection between the supply lines 46 and the inlets 48, and between the return lines 50 and the outlets 52, can be provided via blind mate quick connect/disconnect couplers.

If blind mate quick connect/disconnect couplers are used, a retention mechanism (also referred to as a locking mechanism) may need to be provided to hold each server 16 in position on the module chassis 22 in order to maintain the fluid connection and prevent unwanted movements of the server 16 that could cause partial disconnection of the fluid connection that could cause fluid leakage. For example, referring to FIG. 3, actuatable retention tabs 53, one for each one of the servers 16, can be provided on the module chassis 22. The retention tabs 53 can be individually actuated by actuating levers 55 between a raised position (shown in FIG. 3) to retain the position of its associated server 16 and a lowered position (FIG. 5 shows one of the actuating levers 55 rotated to lower the corresponding tab) allowing removal of the associated server 16 from the module chassis 22.

Referring back to FIG. 2 together with FIG. 4, the supply manifold 42 is fluidly connected to one or more vertical supply manifolds 54 mounted at the rear of the rack 12 and the return manifold 44 is fluidly connected to one or more vertical return manifolds 56 mounted at the rear of the rack 12. The example illustrated in FIG. 2 shows two of the vertical supply manifolds 54 and two of the vertical return manifolds 56. The upper set of the manifolds 54, 56 can be used to service (i.e. provide cooling liquid to and receive cooling liquid from) the upper group of the server module assemblies 14, while the lower set of the manifolds 54, 56 can be used to service the lower group of the server module assemblies 14. The use of two of the vertical supply manifolds 54 and two of the vertical return manifolds 56 also makes it easier to maintain substantially equal pressure of the cooling liquid in each of the servers 16. However, in other embodiments, a single vertical supply manifold 54 and a single vertical return manifold 56 can be used to service both the upper group and the lower group of the server module assemblies 14.

The vertical return manifold(s) 56 is fluidly connected to an inlet of a heat exchanger (not shown) for cooling the returning warm cooling liquid, while the vertical return manifold(s) 56 is fluidly connected to an outlet of the heat exchanger to receive the cooled liquid. A pump (not shown) is provided for pumping the cooling liquid through the system. One or both of the heat exchanger and the pump can be mounted on the rack 12 or the heat exchanger and the pump can be at a location that is separate from the rack 12.

Figure 6:
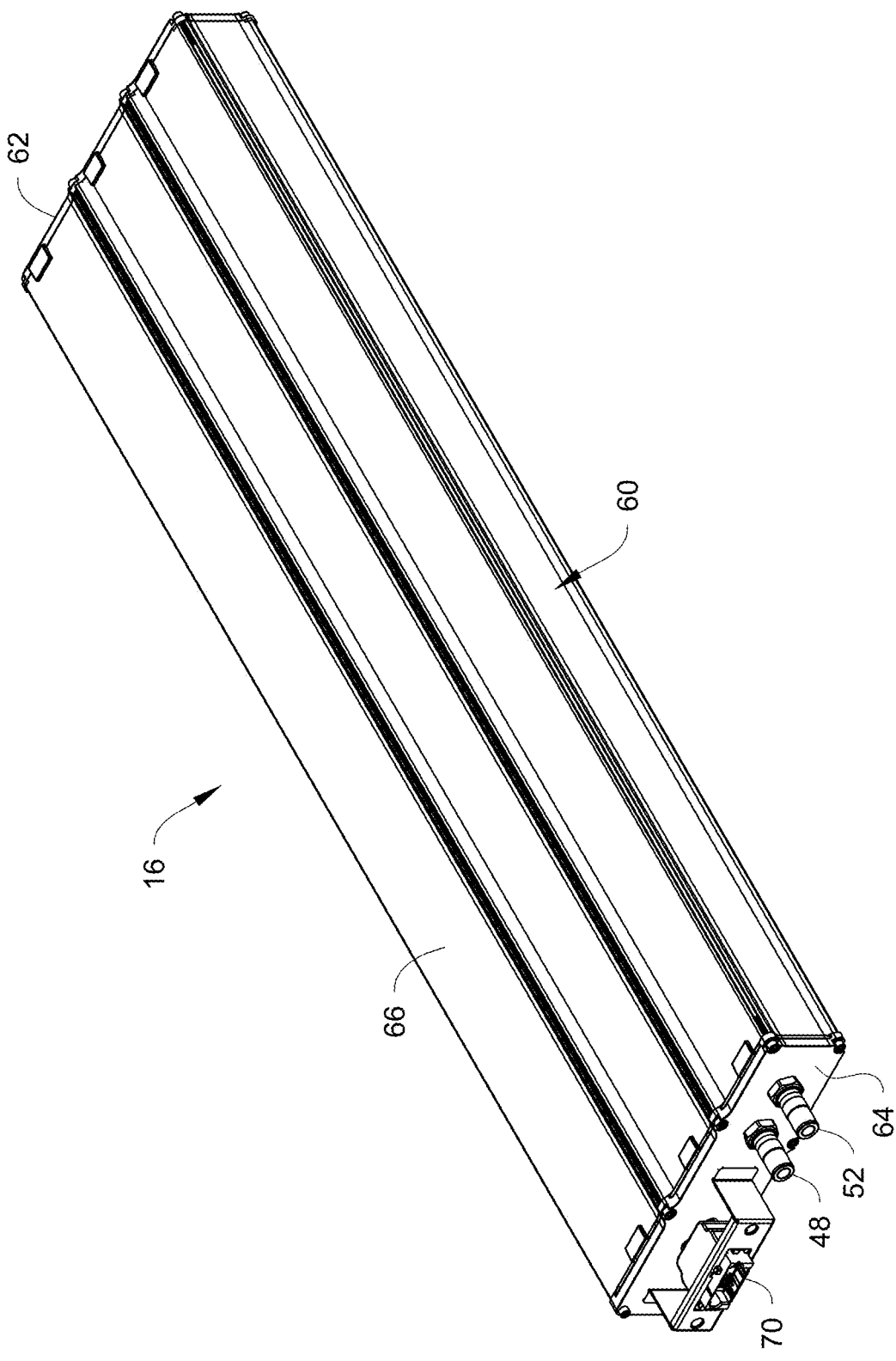
FIG. 6 is a rear perspective view of one of the liquid submersion cooled servers used with the server module assembly of FIGS. 3 and 4.
Figure 7B:
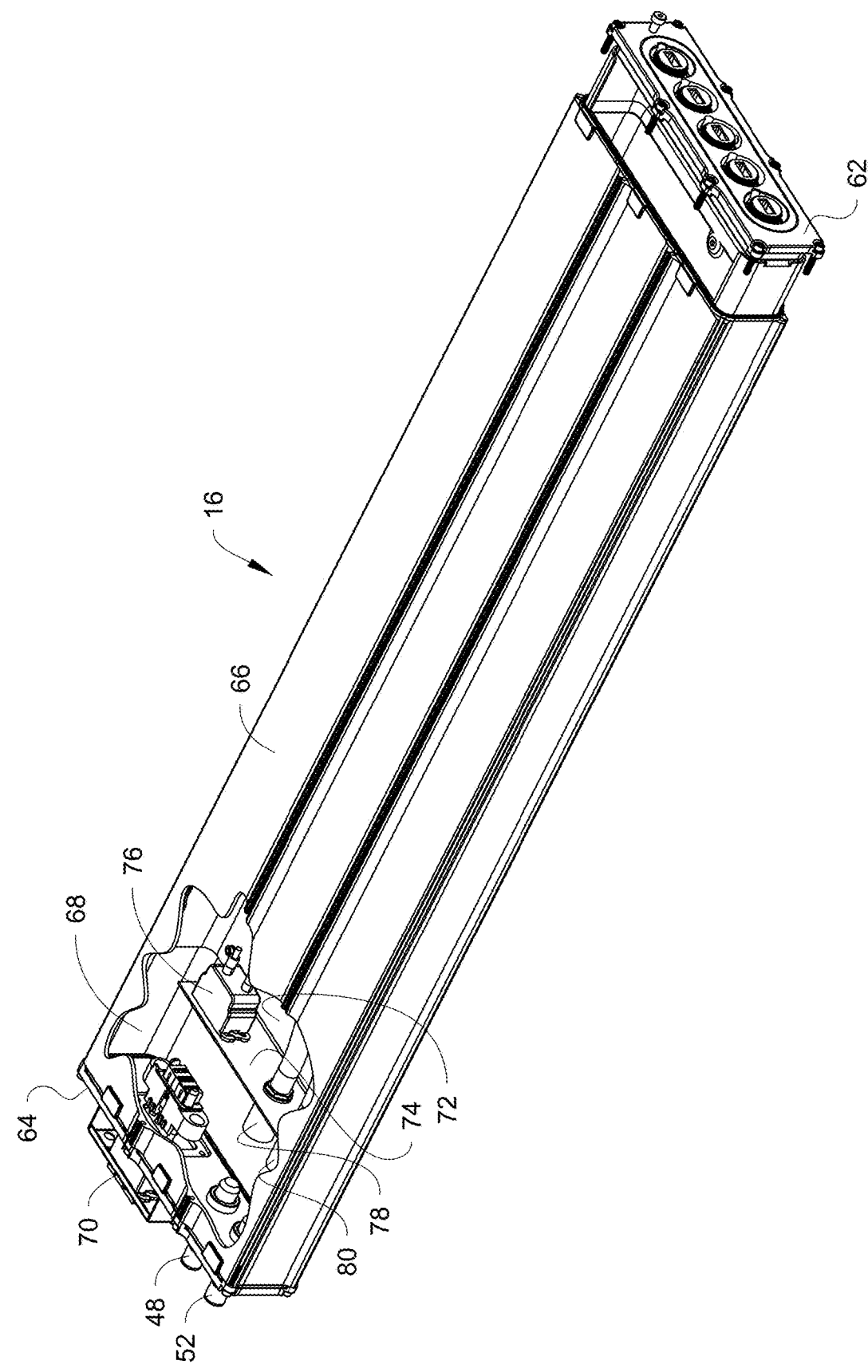
FIG. 7B is a view similar to FIG. 7A but with an internal chassis partially removed.
Figure 15:
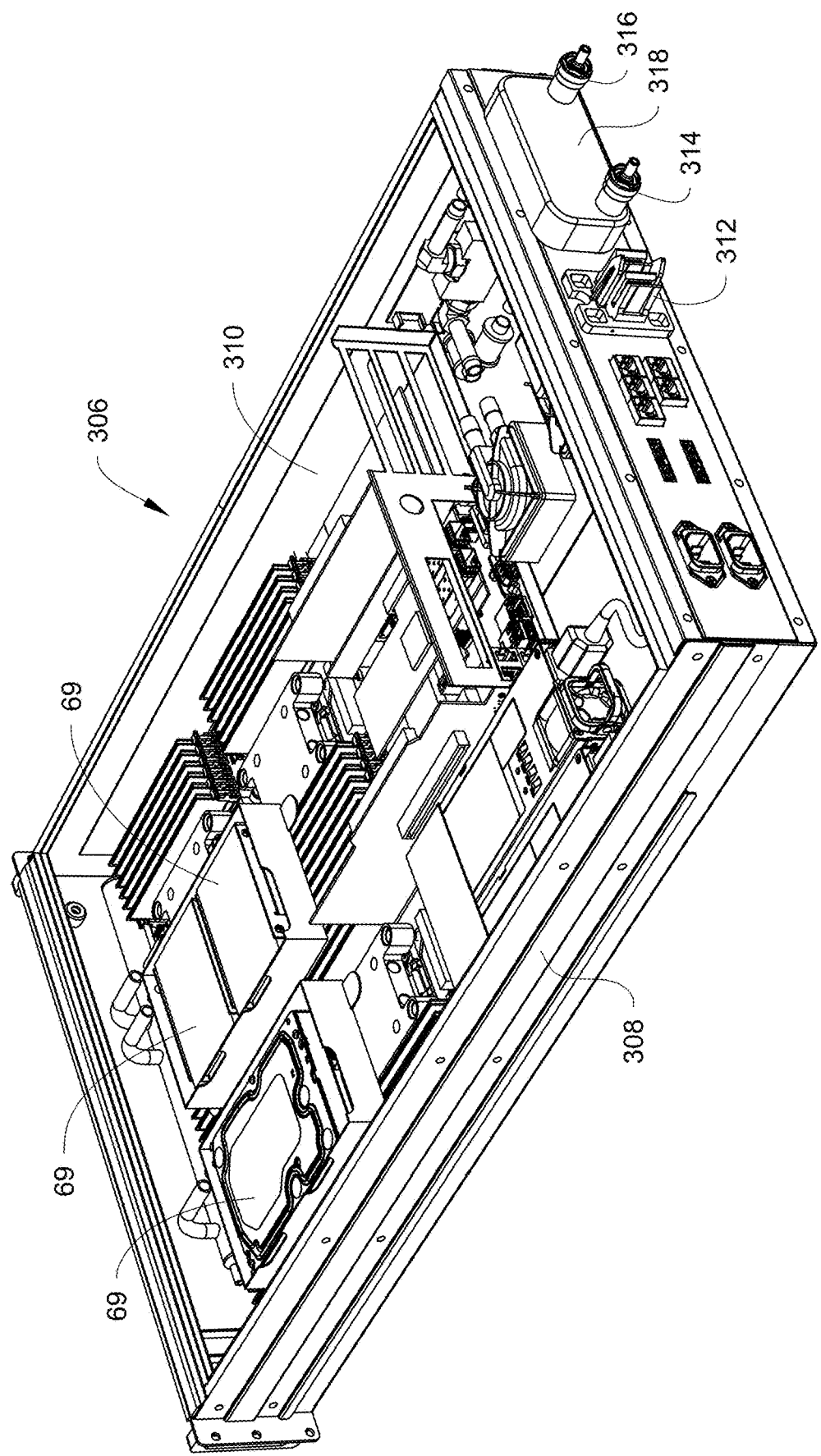
FIG. 15 illustrates another embodiment of a liquid submersion cooled server that can be used in the server systems described herein.

Referring to FIGS. 6, 7A and 7B, an example construction of one of the servers 16 will now be described. Each server 16 includes a housing 60 having a front wall 62, a rear wall 64, and a continuous side wall 66. The walls 62, 64, 66 define a liquid-tight interior space 68. One or more heat generating electronic computing components are disposed within the interior space, and a dielectric cooling liquid is disposed within the interior space and partially or completely submerges, and is in direct contact with, the one or more heat generating electronic computing components. FIG. 15 illustrates various electronic computing components 69, such as CPUs and/or GPUs, in a housing that are liquid-submersion cooled Further details on arranging heat generating electronic computing components in liquid submersion cooled servers and partially or completely submerging the component(s) in a cooling liquid are disclosed in U.S. Pat. Nos. 7,905,106, 8,089,765, and 8,089,766, each of which is incorporated herein by reference in its entirety.

A server power connector 70 is connected to the rear wall 64 and is configured to blind mate connect with one of the power connectors 32 of the module chassis 22 when the server 16 is installed in position on the chassis 22. The server power connector 70 directs electrical power into the interior space 68 of the server 16 for powering the heat generating electronic computing component(s).

Referring to FIGS. 7A and 7B, to facilitate maintenance of internal components of the servers 16, all of the internal components of the server 16 can be mounted on a sub-chassis 72 that is slidably disposed within and slidably removable from the housing 60. The sub-chassis 72 is fixed to the front wall 62 and can be removed from the housing 60 by disconnecting the front wall 62 and using the front wall 62 as a handle to slide the sub-chassis 72 from the housing 60. The sub-chassis 72 includes a rear flange 74 on which is mounted a blind mate power connector 76 and fluid connectors 78, 80 configured to connect to the inlet 48 and the outlet 52, respectively. Rather than removing the entire server 16 from the module chassis 22 for maintenance, the sub-chassis 72 permits removal of just the interior components with the housing 60 (except for the front wall 62) remaining in position on the module chassis 22 with the fluid connections and the blind mate power connection remaining intact. However, the blind mate power connector 76 and the fluid connectors 78, 80 permit disconnection and re-connection of the power and fluid connections upon removal and insertion of the sub-chassis 72.

FIGS. 8-13 illustrate another embodiment of a rack-based server system 100. The server system 100 includes a rack 102 and a plurality of server module assemblies 104 mounted on the rack 102 at different vertical levels. The illustrated example depicts four (4) of the server module assemblies, although a larger or smaller number of server module assemblies 104 can be used. The rack 102 is substantially conventional in construction. In one embodiment, the rack 102 has a configuration that is based on, and satisfies, the Open Compute Project rack specifications.

Figure 8A:
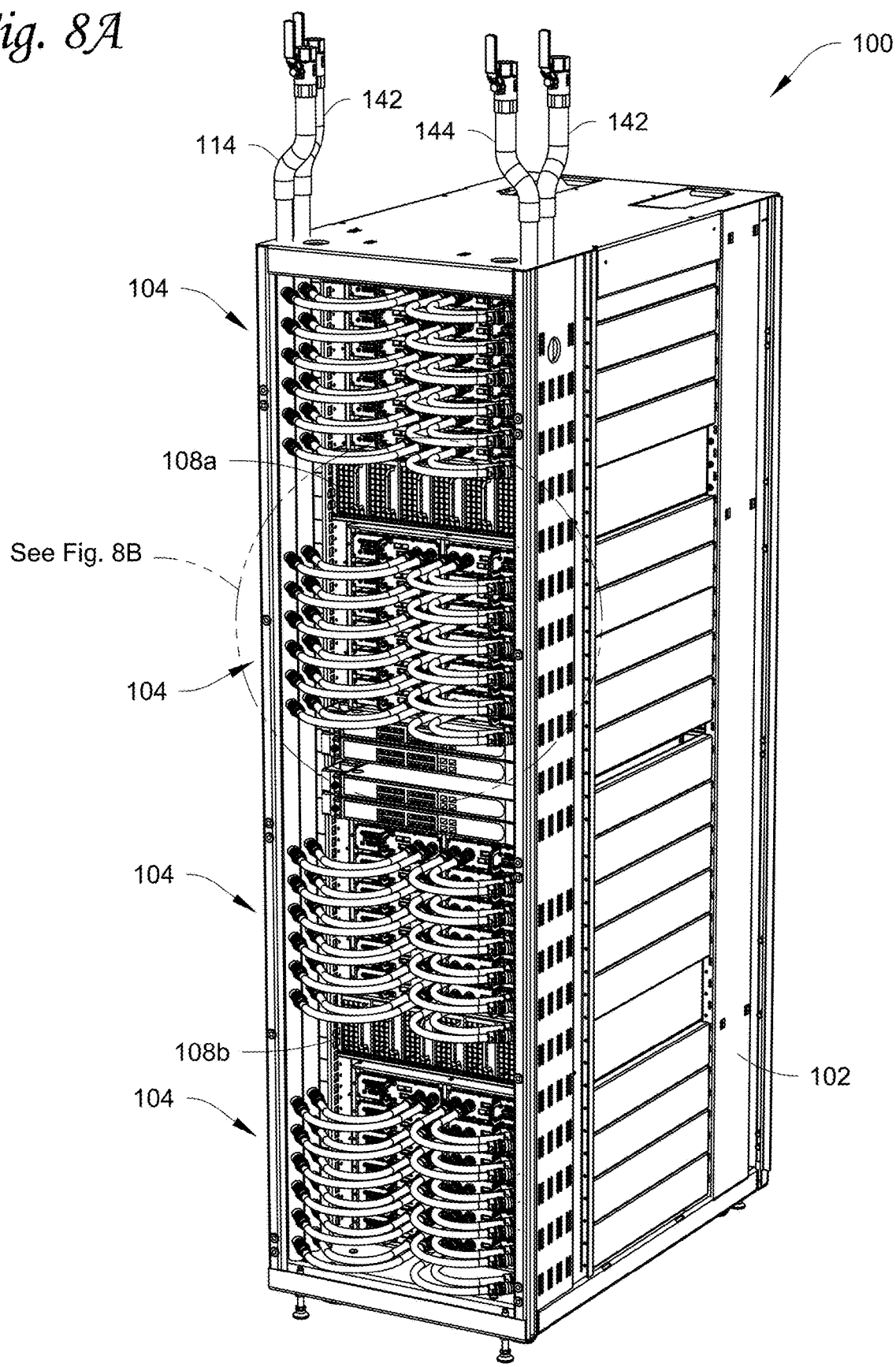
FIG. 8A is a front perspective view of another embodiment of a server system described herein.
Figure 8B:
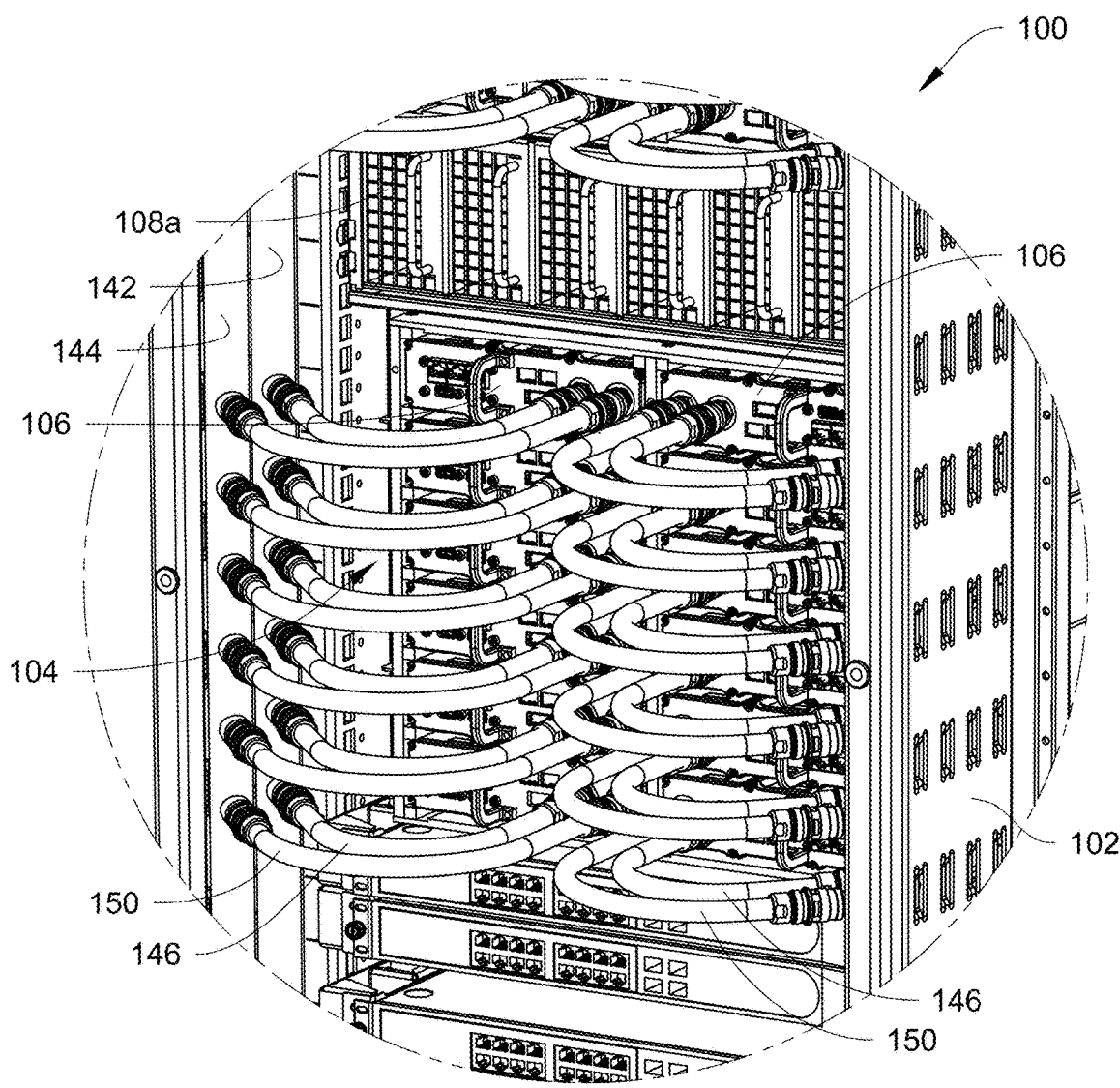
FIG. 8B is a detailed view of the portion of the server system in circle 8 of FIG. 8A.
Figure 9A:
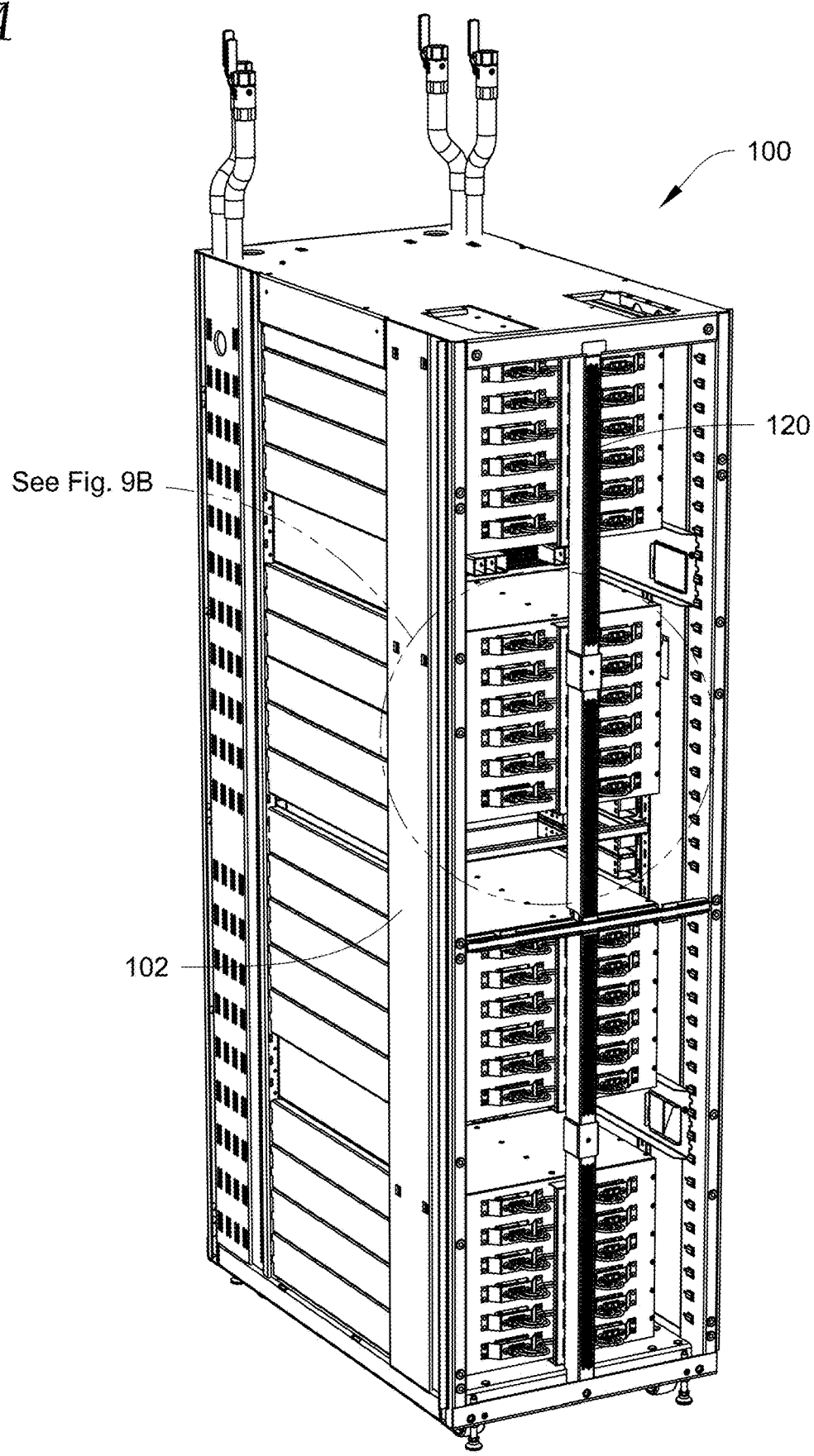
FIG. 9A is a rear perspective view of the server system of FIG. 8A.
Figure 9B:
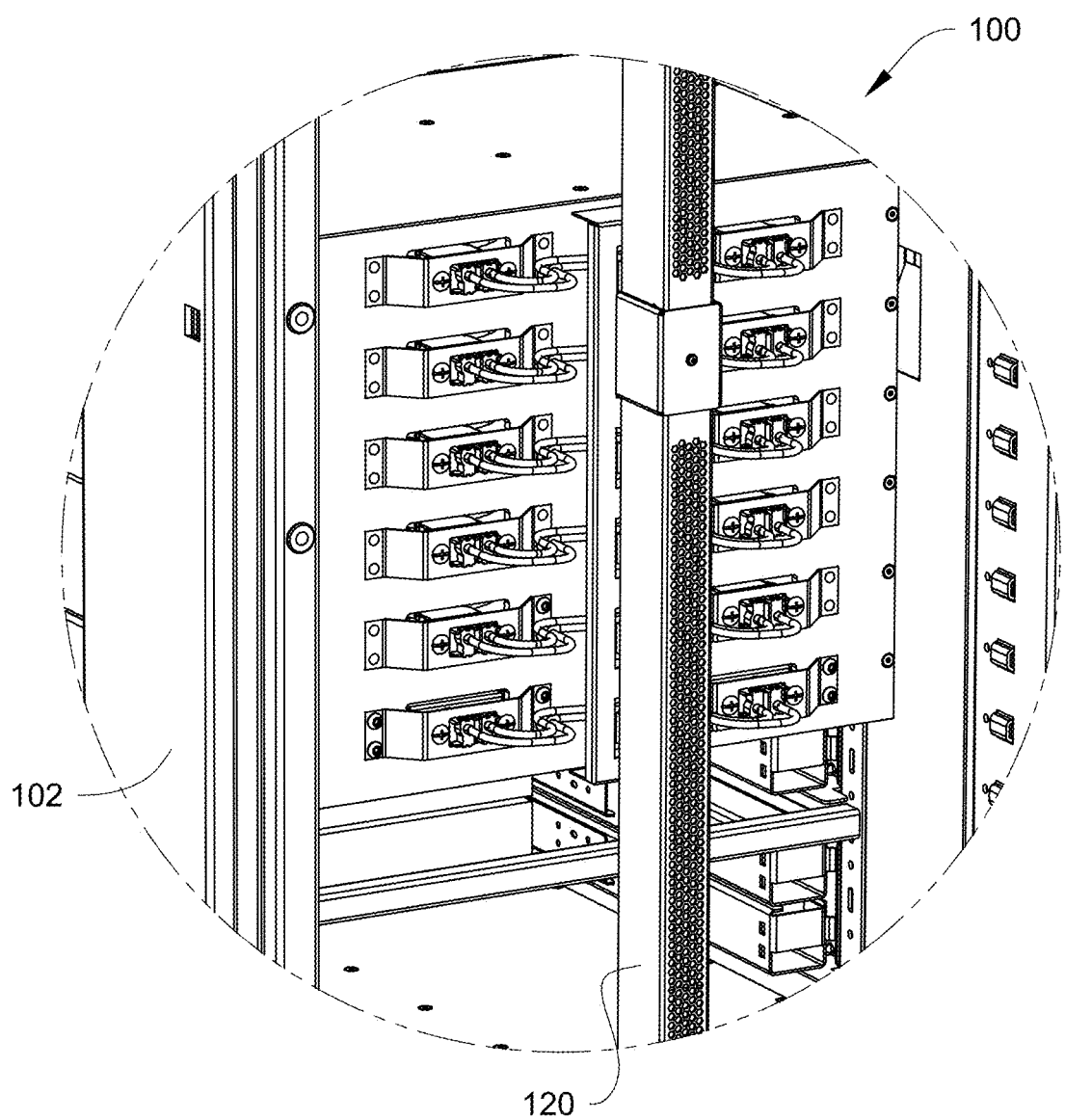
FIG. 9B is a detailed view of the portion of the server system in circle 9 of FIG. 9A.

With continued reference to FIGS. 8A, 8B, 9A and 9B, a first power shelf 108a and a second power shelf 18b are also mounted on the rack 102 for powering the server module assemblies 104. The power shelves 108a, 108b are of conventional construction known in the art. In the illustrated configuration, the first power shelf 108a is dedicated to and powers the two upper server module assemblies 104, and the second power shelf 108b is dedicated to and powers the two lower server module assemblies 104. As best seen in FIGS. 9A and 9B, the rack 102 further includes an electrical power bus bar 120 that extends vertically along the rack 102 at the rear side thereof. The bus bar 120 provides power to the server module assemblies 104.

Figure 10:
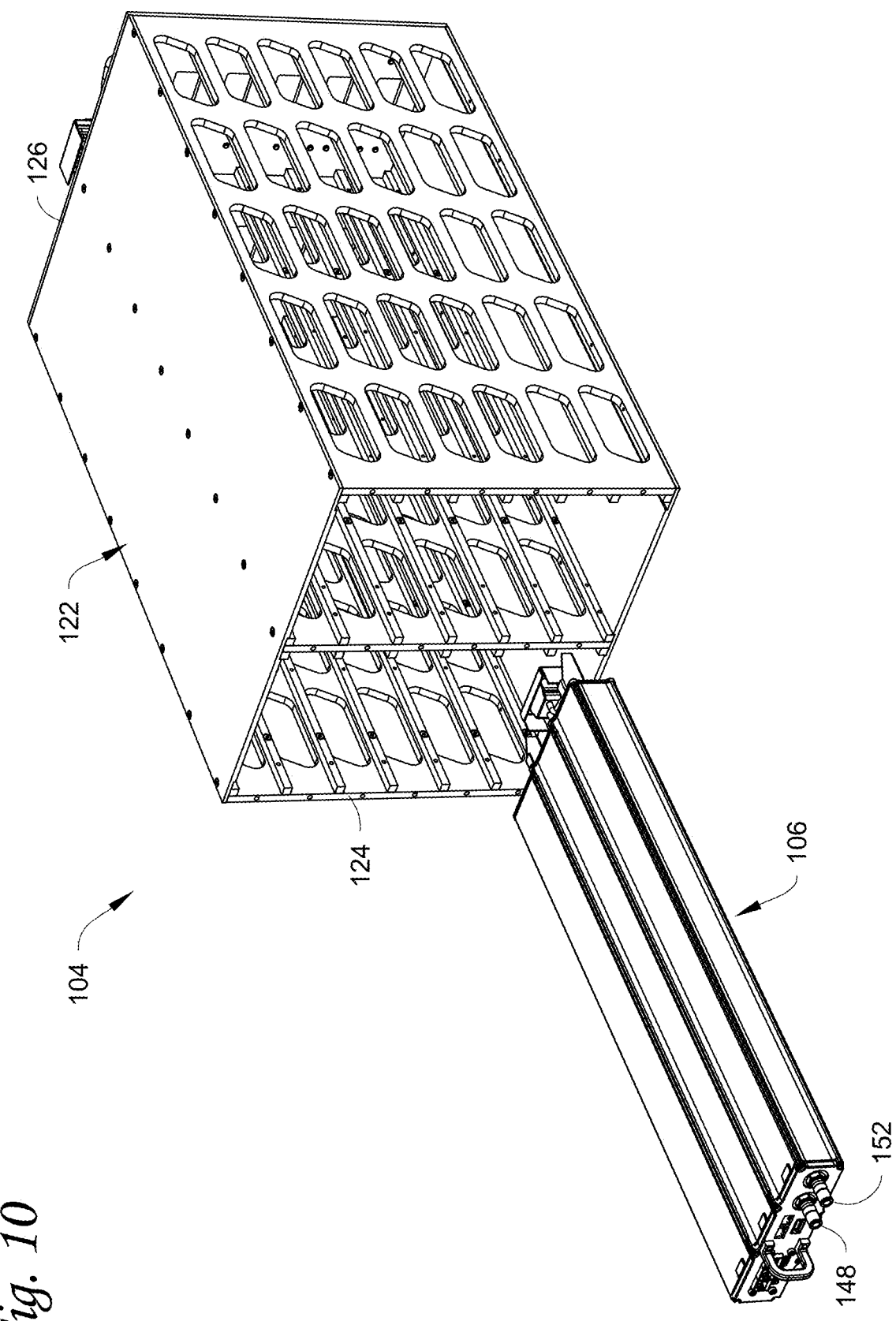
FIG. 10 is a front perspective view of one of the server module assemblies of the server system of FIG. 8A, with the module chassis and one liquid submersion cooled server.
Figure 11:
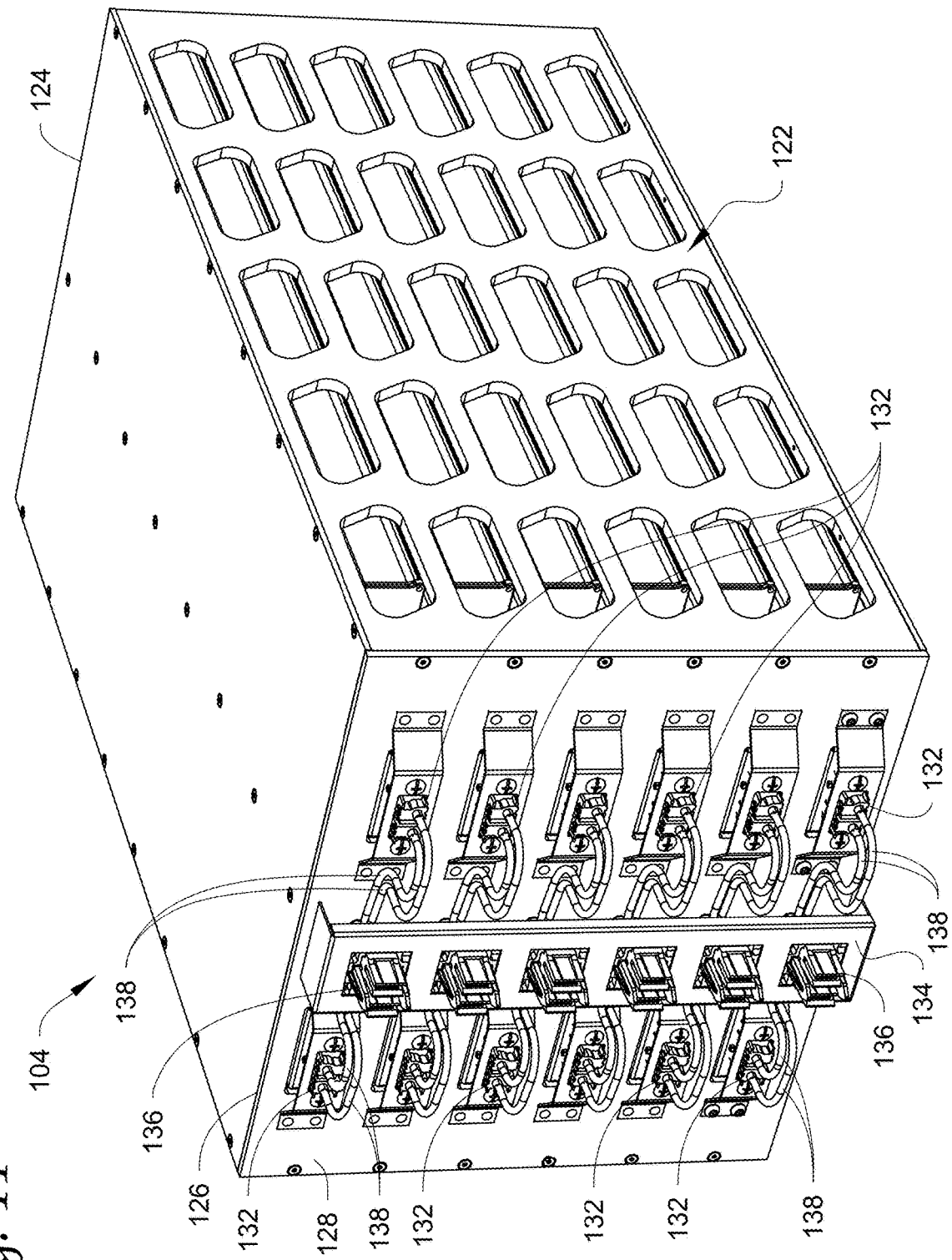
FIG. 11 is a rear perspective view of the server module assembly of FIG. 10.

Turning now to FIGS. 10 and 11 an embodiment of one of the server module assemblies 104 is illustrated. The server module assemblies 104 are substantially identical to one another, however they can have different constructions in some embodiments. In the illustrated example, each server module assembly 104 is depicted as including twelve (12) liquid submersion cooled servers 106, although a larger or smaller number of liquid submersion cooled servers 106 can be used on each server module assembly 104.

Each server module assembly 104 includes a module chassis 122 that is configured to mount the liquid submersion cooled servers 106 thereon in a horizontal orientation. The module chassis 122 includes a front side 124 and a rear side 126 with the front side 124 disposed toward the front of the rack 102 and the rear side 126 disposed toward the rear of the rack 102. The module chassis 122 can be slidably mounted on the rack 102 to allow the module chassis 122 and the servers 106 disposed thereon, to be slid into and out from the rack 102.

A rear wall 128 closes the module chassis 122 at the rear side 126 thereof. The rear wall 128 is configured to interface with each one of the servers 106 and with the bus bar 120 to direct electrical power from the bus bar 120 into each server 106. For example, as best seen in FIG. 11, the rear wall 128 includes a plurality of blind-mate power connectors 132, one for each of the servers 106, that extend through the rear wall 128. A bus bar connector strip 134 is fixed to the rear wall 128, and the bus bar connector strip 134 has bus bar electrical connectors 136, in the illustrated example 6 connectors 136, spaced from one another along a length of the bus bar connector strip 134. Each bus bar electrical connector 136 is electrically connected to two of the power connectors 132 via wires 138. The bus bar electrical connectors 136 are conventional in construction and include biased clips that slidably receive a terminal of the bus bar 120 therein.

Returning to FIGS. 8A and 8B, and with reference to FIG. 10, vertical cooling liquid supply manifolds 142 and vertical cooling liquid return manifolds 144 are mounted on the rack 102 at the front side thereof. The supply manifolds 142 supply returning cool cooling liquid to each of the servers 106, while the return manifolds 144 receive warm or heated cooling liquid from each of the servers 106 after cooling the electronic component(s) in the servers 106. In particular, from the view of the rack 102 in FIGS. 8A and 8B, the supply manifold 142 and the return manifold 144 on the right side of the rack 102 service the servers 106 that are disposed on the right side of each one of the server module assemblies 104, while the supply manifold 142 and the return manifold 144 on the left side of the rack 102 service the servers 106 that are disposed on the left side of each one of the server module assemblies 104.

Cooling liquid supply lines 146 extend from the supply manifolds 142 to a cooling liquid inlet 148 provided at the front of each one of the servers 106, and cooling liquid return lines 150 extend from the return manifolds 144 to a cooling liquid outlet 152 provided at the front of each one of the servers 106. Connection between the supply lines 146 and the inlets 148, and between the return lines 150 and the outlets 152, can be provided via manual fluid couplings as depicted in FIG. 8B. In other embodiments, described further below, connection between the supply lines 146 and the inlets 148, and between the return lines 150 and the outlets 152, can be provided via blind mate quick connect/disconnect couplers.

The vertical return manifolds 144 are fluidly connected to an inlet of a heat exchanger (not shown) for cooling the returning warm cooling liquid, while the vertical return manifolds 142 are fluidly connected to an outlet of the heat exchanger to receive the cooled liquid. A pump (not shown) is provided for pumping the cooling liquid through the system. One or both of the heat exchanger and the pump can be mounted on the rack 102 or the heat exchanger and the pump can be at a location that is separate from the rack 102.

Figure 12:
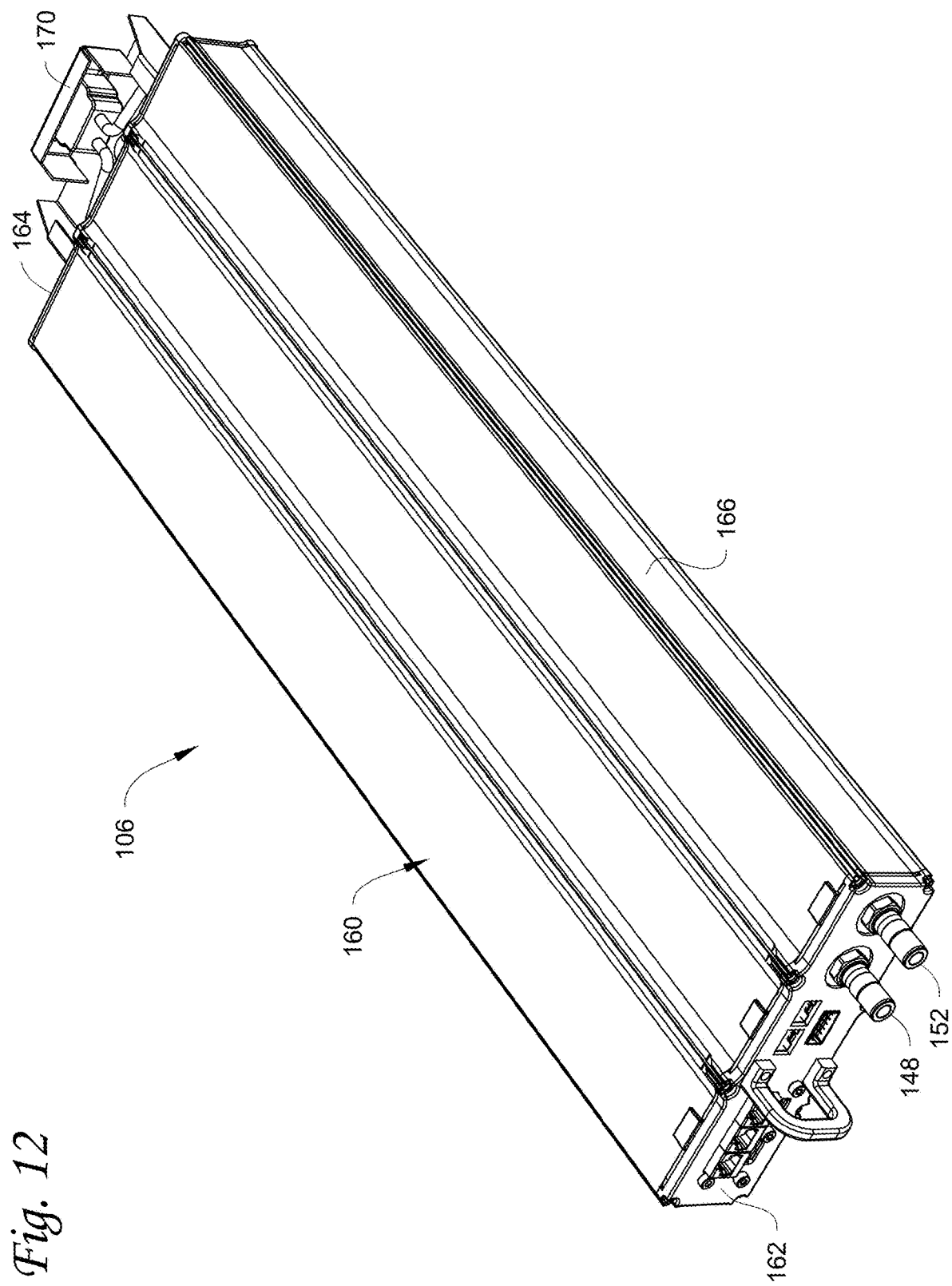
FIG. 12 is a front perspective view of one of the liquid submersion cooled servers used with the server module assembly of FIGS. 10 and 11.
Figure 13:
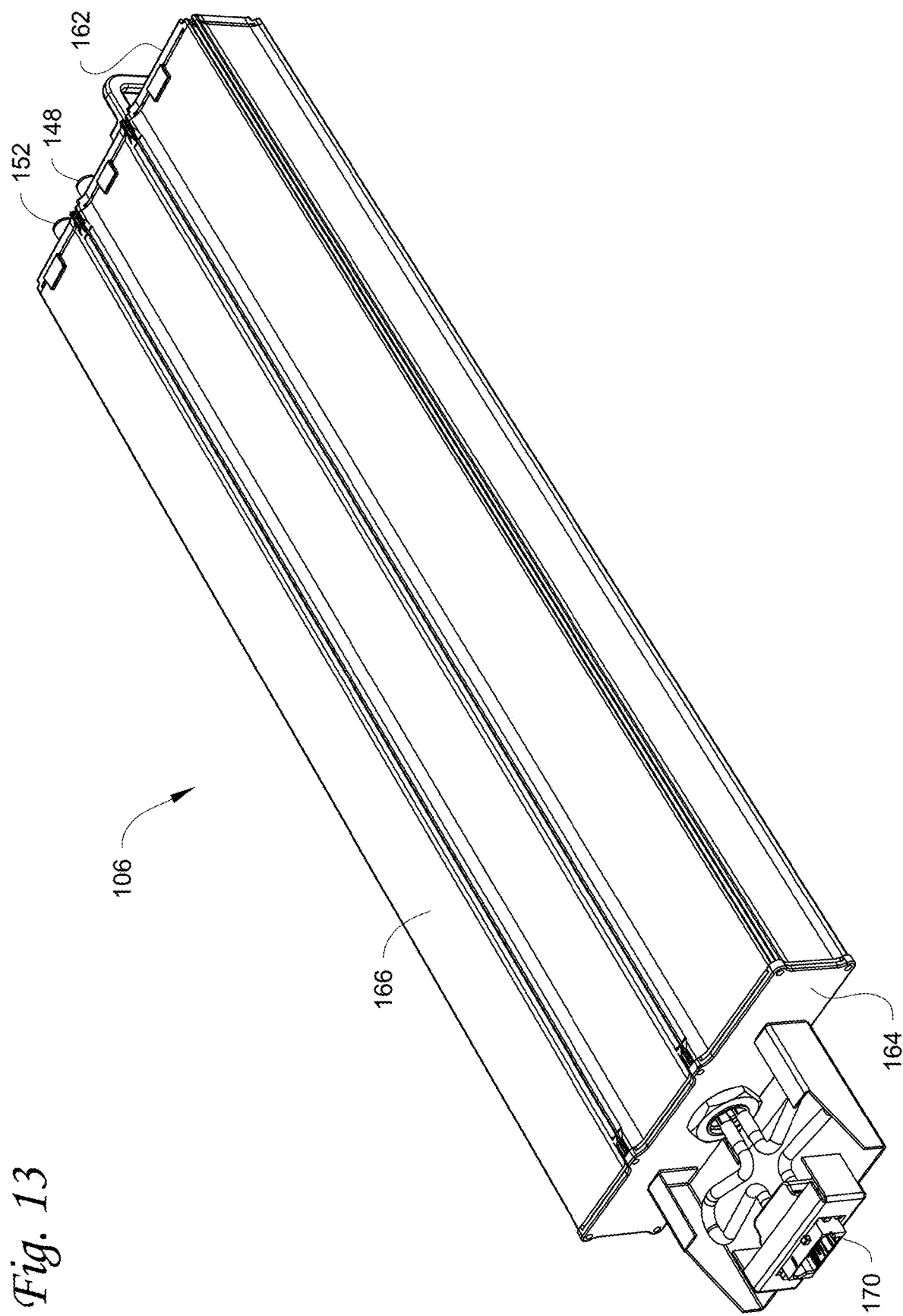
FIG. 13 is a rear perspective view of the liquid submersion cooled server of FIG. 12.

Referring to FIGS. 12 and 13, an example construction of one of the servers 106 will now be described. Each server 106 includes a housing 160 having a front wall 162, a rear wall 164, and a continuous side wall 166. The walls 162, 164, 166 define a liquid-tight interior space. One or more heat generating electronic computing components are disposed within the interior space, and a dielectric cooling liquid is disposed within the interior space and partially or completely submerges, and is in direct contact with, the one or more heat generating electronic computing components. Further details on arranging heat generating electronic computing components in liquid submersion cooled servers and partially or completely submerging the component(s) in a cooling liquid are disclosed in U.S. Pat. Nos. 7,905,106, 8,089,765, and 8,089,766, each of which is incorporated herein by reference in its entirety.

A server power connector 170 is connected to the rear wall 164 and is configured to blind mate connect with one of the power connectors 132 of the module chassis 122 when the server 106 is installed in position on the chassis 122. The server power connector 170 directs electrical power into the interior space of the server 106 for powering the heat generating electronic computing component(s). As the server 106 is being slid into position in the module chassis 122, the server power connector 170 blind mate connects to one of the power connectors 132. Fluid connections for circulating the cooling liquid into and from the housing 160 can also be established by connecting one of the supply lines 146 and one of the return lines 150 to the inlet 148 and the outlet 152 respectively.

Figure 14:
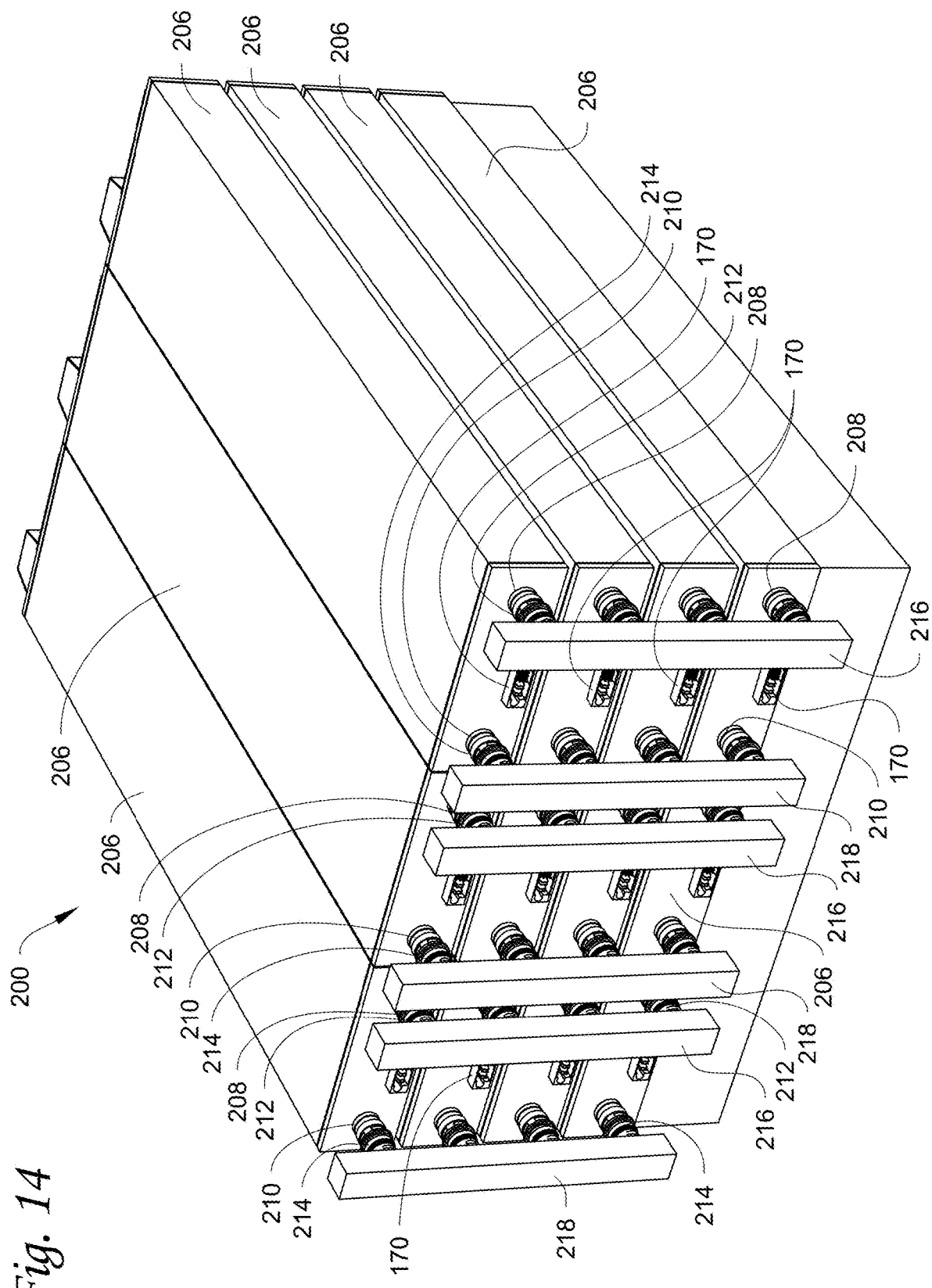
FIG. 14 is a rear perspective view of a variation of the server system of FIGS. 8-13 showing the liquid submersion cooled server with a fluid inlet and fluid outlet at the rear and configured for blind mate fluid connection to blind mate fluid connectors on the module chassis.

FIG. 14 illustrates another embodiment of a liquid submersion cooled server 200 where each of the liquid submersion cooled servers 206 of the server module assembly are configured to achieve blind mate power connection as well as blind mate fluid connection. The servers 206 can have a horizontal orientation on the module chassis (not shown) similar to the orientation in FIGS. 8-13. In other embodiments, the servers 206 can have a vertical orientation on the module chassis (not shown) similar to the orientation in FIGS. 1-7.

In the embodiment of FIG. 14, each one of the servers 206 has a cooling liquid inlet 208 and a cooling liquid outlet 210 at the rear of a liquid-tight housing, and the inlet 208 and the outlet 210 are configured with quick connect/disconnect fluid couplers for blind mate fluid connection to blind mate fluid connectors 212, 214 on the module chassis. The blind mate fluid connectors 212, 214 can be part of vertical cooling liquid supply manifolds 216 and vertical cooling liquid return manifolds 218 that are similar in function to the manifolds 42, 44. Each server 206 can also include the server power connector 170 that blind mate connects with a power connector of the module chassis when the server 206 is installed in position on the module chassis.

FIG. 15 illustrates another embodiment of a liquid submersion cooled server 306 that can be used in the server systems described herein, for example with the server system 100 of FIGS. 8A, 8B, 9A and 9B. The server 306 can have a construction similar to that described in U.S. patent application Ser. No. 16/145,408 filed on Sep. 28, 2018 and titled Liquid Submersion Cooled Electronic Systems and Devices, the entire contents of which are incorporated herein by reference. In this embodiment, the server 306 includes a non-pressurized (or "zero" pressure) liquid-tight tray 308 defining an interior space 310 where pressure in the interior space equals, or is only slightly greater than, pressure outside the non-pressurized tray 308. A cover (not shown) that removably fits on the tray 308 to prevent contaminants from falling into cooling liquid that is contained with the interior space 310 of the tray 308.

The server 306 in FIG. 15 differs from the device disclosed in U.S. patent application Ser. No. 16/145,408 in that the server 306 includes a server power connector 312 is connected to a rear wall of the tray 308 and is configured to blind mate connect with a power connectors of the module chassis when the server 306 is installed in position on the module chassis as described above. In addition, the server 306 can include blind mate fluid connectors 314, 316 that are configured with quick connect/disconnect fluid couplers for blind mate fluid connection to blind mate fluid connectors on the module chassis as described above.

In the embodiment in FIG. 15, cooling liquid can remain substantially within the tray 308 although circulated to a heat exchanger 318 that is mounted on the rear wall of the tray 308. In this embodiment, the fluid connectors 314, 316 can blind mate connect with blind mate fluid connectors of a secondary cooling fluid loop with circulates a secondary cooling liquid through the heat exchanger 318 to cool the cooling liquid that is within the tray 308. In another embodiment, the heat exchanger 318 can be disposed within the tray 308, or the heat exchanger 318 can be distant from the tray 308 in which case the cooling liquid within the tray 318 is circulated externally of the tray through one of the fluid connectors 314, 316 and then returned back into the tray 308 through the other fluid connector 314, 316.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A server module assembly, comprising:
a module chassis that is configured to mount a plurality of liquid submersion cooled servers thereon, the module chassis includes a front side and a rear side, and power connectors disposed at the rear side;
a bus bar connector strip disposed at the rear side of the module chassis, the bus bar connector strip includes bus bar electrical connectors spaced from one another along a length of the bus bar connector strip, and each of the bus bar electrical connectors is electrically connected to at least two of the power connectors; and
the plurality of liquid submersion cooled servers mounted on the module chassis, each of the liquid submersion cooled servers includes: a housing defining an interior space and having a front wall and a rear wall, a heat generating electronic computing component within the interior space, a dielectric cooling liquid within the interior space and submerging, and in direct contact with, the heat generating electronic computing component, and a server power connector connected to the rear wall and configured to blind mate connect with a respective one of the power connectors of the module chassis, whereby each one of the server power connectors directs electrical power into the interior space of a corresponding one of the liquid submersion cooled servers for powering the heat generating electronic computing component,
wherein one of the bus bar electrical connectors is configured to be electrically connected with the server power connectors of a first one and a second one of the liquid submersion cooled servers each blind mated to a respective one of the power connectors that is electrically connected with the one of the bus bar electrical connectors,
wherein another one of the bus bar electrical connectors is configured to be electrically connected with the server power connectors of a third one and a fourth one of the liquid submersion cooled servers each blind mated to a respective another one of the power connectors that is electrically connected with the another one of the bus bar electrical connectors, and
wherein the one of the bus bar electrical connectors is configured for powering the first and second ones of the liquid submersion cooled servers in parallel with the another one of the bus bar electrical connectors configured for powering the third and fourth ones of the liquid submersion cooled servers.

2. The server module assembly of claim 1, wherein each housing is liquid-tight, and further comprising a liquid inlet in each housing through which cooled dielectric cooling liquid can enter the housing and a liquid outlet in each housing through which heated dielectric cooling liquid can exit the housing.

3. The server module assembly of claim 2, wherein the liquid inlet and the liquid outlet are on the rear wall of each housing.

4. The server module assembly of claim 2, wherein the liquid inlet and the liquid outlet are on the front wall of each housing.

5. The server module assembly of claim 3, further comprising a supply manifold disposed at the rear side of the module chassis in a horizontal orientation, the supply manifold is fluidly connected to each liquid inlet; and a return manifold disposed at the rear side of the module chassis in a horizontal orientation, the return manifold is fluidly connected to each liquid outlet.

6. The server module assembly of claim 1, wherein each of the liquid submersion cooled servers is mounted in a vertical orientation with the housing of each of the liquid submersion cooled servers disposed vertically.

7. The server module assembly of claim 1, wherein each of the liquid submersion cooled servers is mounted in a horizontal orientation with the housing of each of the liquid submersion cooled servers disposed horizontally.

8. The server module assembly of claim 1, wherein there are eight of the liquid submersion cooled servers mounted on the module chassis.

9. The server module assembly of claim 1, wherein there are twelve of the liquid submersion cooled servers mounted on the module chassis.

10. A server rack, comprising a plurality of server module assemblies of claim 1 mounted on the server rack, a power shelf, and a bus bar that is electrically connected to the power shelf and that is electrically connected to the bus bar electrical connectors.

11. A server system, comprising:
a rack;
a plurality of liquid submersion cooled servers;
a first group of the liquid submersion cooled servers mounted on the rack;
a first power shelf mounted on the rack and electrically connected to the first group of the liquid submersion cooled servers to provide electrical power to the first group;
a second group of the liquid submersion cooled servers mounted on the rack below the first group;
and a second power shelf mounted on the rack below the first group and below the first power shelf, the second power shelf is electrically connected to the second group of liquid submersion cooled servers to provide electrical power to the second group,
wherein the first group of the liquid submersion cooled servers and the second group of the liquid submersion cooled servers each comprises:
a plurality of server module assemblies, each one of the server module assemblies includes:
a module chassis that is configured to mount the plurality of liquid submersion cooled servers of a respective one of the first and second groups thereon, the module chassis includes a front side and a rear side, and power connectors disposed at the rear side of the module chassis;
a bus bar connector strip disposed at the rear side of the module chassis, the bus bar connector strip includes bus bar electrical connectors spaced from one another along a length of the bus bar connector strip, and each bus bar electrical connector is electrically connected to at least two of the power connectors; and
the plurality of liquid submersion cooled servers of the respective one of the first and second groups mounted on the module chassis, each of the liquid submersion cooled servers includes: a housing defining an interior space and having a front wall and a rear wall, a heat generating electronic computing component within the interior space, a dielectric cooling liquid within the interior space and submerging, and in direct contact with, the heat generating electronic computing component, and a server power connector connected to the rear wall and configured to blind mate connect with a respective one of the power connectors of the module chassis, whereby each one of the server power connectors directs electrical power into the interior space of a corresponding one of the liquid submersion cooled servers for powering the heat generating electronic computing component, wherein one of the bus bar electrical connectors is electrically connected with the server power connectors of a first one and a second one of the liquid submersion cooled servers each blind mated to a respective one of the power connectors that is electrically connected with the one of the bus bar electrical connectors, wherein another one of the bus bar electrical connectors is electrically connected with the server power connectors of a third one and a fourth one of the liquid submersion cooled servers each blind mated to a respective another one of the power connectors that is electrically connected with the another one of the bus bar electrical connectors, and wherein the one of the bus bar electrical connectors is configured for powering the first and second ones of the liquid submersion cooled servers in parallel with the another one of the bus bar electrical connectors configured for powering the third and fourth ones of the liquid submersion cooled servers.

12. The server system of claim 11, wherein the rack includes a bus bar at a rear side of the rack, and the bus bar is electrically connected to the first power shelf and to the second power shelf, and the bus bar is electrically connected to the bus bar electrical connectors of each bus bar connector strip.

13. The server system of claim 11, wherein each of the liquid submersion cooled servers is mounted in a vertical orientation with the housing of each of the liquid submersion cooled servers disposed vertically.

14. The server system of claim 11, wherein each of the liquid submersion cooled servers is mounted in a horizontal orientation with the housing of each of the liquid submersion cooled servers disposed horizontally.

15. The server system of claim 11, wherein each one of the server module assemblies has eight of the liquid submersion cooled servers mounted on the module chassis.

16. The server system of claim 11, wherein each one of the server module assemblies has twelve of the liquid submersion cooled servers mounted on the module chassis.

17. A server module assembly, comprising:
a module chassis that is configured to mount a plurality of liquid submersion cooled servers thereon, the module chassis includes a front side and a rear side, and power connectors disposed at the rear side, the power connectors are aligned with one another along a horizontal axis;
a bus bar connector strip disposed at the rear side of the module chassis, the bus bar connector strip is oriented vertically along a vertical axis that is perpendicular to the horizontal axis, the bus bar connector strip includes bus bar electrical connectors spaced from one another along a length of the bus bar connector strip; and
the plurality of liquid submersion cooled servers mounted on the module chassis, each of the liquid submersion cooled servers includes: a housing defining an interior space and having a front wall and a rear wall, a heat generating electronic computing component within the interior space, a dielectric cooling liquid within the interior space and submerging, and in direct contact with, the heat generating electronic computing component, and a server power connector connected to the rear wall and configured to blind mate connect with a respective one of the power connectors of the module chassis, whereby each one of the server power connectors directs electrical power into the interior space of a corresponding one of the liquid submersion cooled servers for powering the heat generating electronic computing component, wherein one of the bus bar electrical connectors is electrically connected with the server power connector of a first one of the liquid submersion cooled servers blind mated to a respective one of the power connectors that is electrically connected with the one of the bus bar electrical connectors, and wherein another one of the bus bar electrical connectors is electrically connected with the server power connector of a second one of the liquid submersion cooled servers blind mated to a respective another one of the power connectors that is electrically connected with the another one of the bus bar electrical connectors, and wherein the one of the bus bar electrical connectors is configured for powering the first one of the liquid submersion cooled servers in parallel with the another one of the bus bar electrical connectors configured for powering the second one of the liquid submersion cooled servers.

18. The server module assembly of claim 17, comprising a plurality of vertical levels of the power connectors.

* * * * *